(12) United States Patent
Kim et al.

(10) Patent No.: US 11,688,684 B2
(45) Date of Patent: Jun. 27, 2023

(54) SEMICONDUCTOR STRUCTURE AND METHOD FOR FABRICATING THE SAME

(71) Applicant: XIA TAI XIN SEMICONDUCTOR (QING DAO) LTD., Qingdao (CN)

(72) Inventors: Hyunyoung Kim, Singapore (SG); Dowon Kwak, Singapore (SG); Kang-Won Seo, Singapore (SG)

(73) Assignee: XIA TAI XIN SEMICONDUCTOR (QING DAO) LTD., Qingdao (CN)

( * ) Notice: Subject to any disclaimer, the term of this patent is extended or adjusted under 35 U.S.C. 154(b) by 36 days.

(21) Appl. No.: 17/576,683

(22) Filed: Jan. 14, 2022

(65) Prior Publication Data

US 2022/0139827 A1 May 5, 2022

Related U.S. Application Data

(62) Division of application No. 16/703,880, filed on Dec. 5, 2019, now Pat. No. 11,257,752.

(60) Provisional application No. 62/778,908, filed on Dec. 13, 2018, provisional application No. 62/778,922, filed on Dec. 13, 2018.

(51) Int. Cl.
*H01L 23/522* (2006.01)
*H01L 23/532* (2006.01)
*H01L 21/768* (2006.01)
*H01L 21/285* (2006.01)

(52) U.S. Cl.
CPC .... *H01L 23/5226* (2013.01); *H01L 21/76802* (2013.01); *H01L 21/76849* (2013.01); *H01L 21/76877* (2013.01); *H01L 21/76885* (2013.01); *H01L 23/5329* (2013.01); *H01L 23/53219* (2013.01); *H01L 23/53223* (2013.01); *H01L 23/53261* (2013.01); *H01L 23/53266* (2013.01); *H01L 21/28568* (2013.01)

(58) Field of Classification Search
None
See application file for complete search history.

(56) References Cited

U.S. PATENT DOCUMENTS

| | | | | |
|---|---|---|---|---|
| 5,969,422 A | * | 10/1999 | Ting | H01L 21/76846 257/769 |
| 2006/0157854 A1 | * | 7/2006 | Takewaki | H01L 23/53238 257/E21.585 |
| 2008/0290515 A1 | * | 11/2008 | Arunachalam | H01L 21/76846 257/E21.24 |

(Continued)

FOREIGN PATENT DOCUMENTS

CN 1722433 A 1/2006

*Primary Examiner* — Evren Seven
(74) *Attorney, Agent, or Firm* — ScienBiziP, P.C.

(57) ABSTRACT

A semiconductor structure and a method of fabricating the same is disclosed. The semiconductor device includes a conductive structure that comprises: an upper conductive line arranged above and in electrical connection with a circuit component in a lower device layer through a via plug, wherein the upper conductive line extends laterally over the via plug; an interposing layer having a substantially uniform thickness arranged between the via plug and the upper conductive line, and extending laterally beyond a planar projection of the via plug, wherein the upper conductive line is in electrical connection with the via plug through the interposing layer; and an overlayer is disposed over the upper conductive line.

10 Claims, 9 Drawing Sheets

(56) References Cited

U.S. PATENT DOCUMENTS

| | | | | |
|---|---|---|---|---|
| 2014/0021615 A1* | 1/2014 | Ryan | ............... | H01L 21/76886 438/653 |
| 2014/0264880 A1* | 9/2014 | Sung | ............... | H01L 23/53295 438/622 |
| 2014/0291847 A1* | 10/2014 | Zhang | ............. | H01L 21/76856 438/653 |
| 2014/0327117 A1* | 11/2014 | Bencher | ............ | H01L 21/3086 257/649 |

* cited by examiner

SEMICONDUCTOR STRUCTURE AND METHOD FOR FABRICATING THE SAME

FIELD

The present disclosure generally relates to fabrication of semiconductor device, and more particularly pertains to providing interconnect structure for semiconductor device having enhanced electrical characteristics.

BACKGROUND

As integrated circuits (IC) are developed, the desire for higher device density and operation speed becomes never-ending quests for those skilled in the art. With millions of miniature circuit elements connected through a network of interconnect components, the electrical properties of the interconnect structure greatly affect the device performance.

For one thing, diffusion or electromigration of metal materials in the interlayer dielectrics may generate contamination and shorting issues. Moreover, in some applications, different conductive materials are employed in different interconnect components. The interface between different interconnect components where different metal materials meet may 20 encounter intermetallic composites (IMCs) non-uniformity issues that leads to reduced electrical performance.

In addition, patterning process for the interconnect metal sometimes encounters low exposure efficiency due to high surface reflectivity and defect issues due to etching chemical corrosion during photolithography process.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

Figure 1:
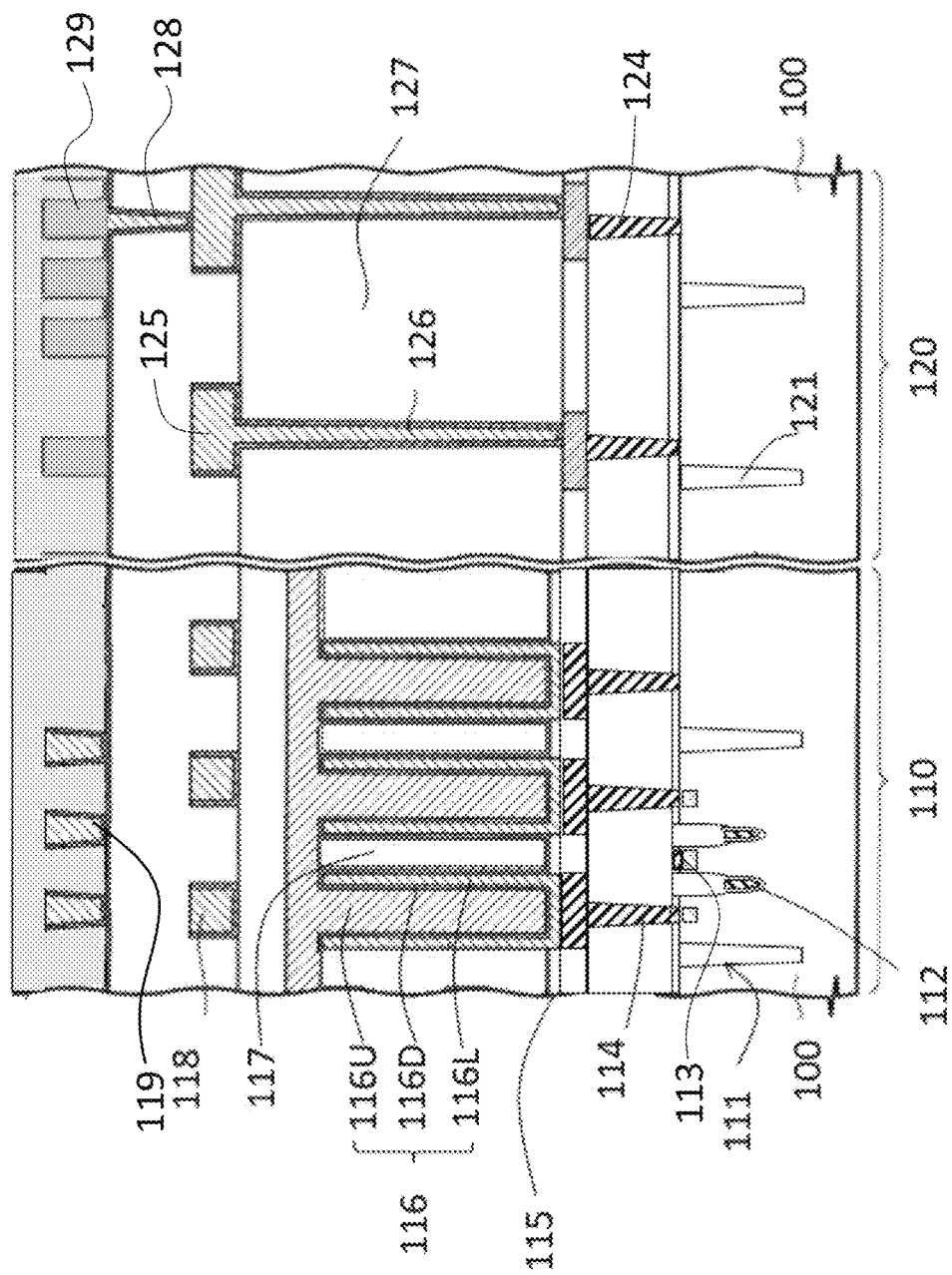
FIG. 1 shows a regional cross section view of an exemplary semiconductor device in accordance with some embodiments of the instant disclosure.

It is to be noted, however, that the appended drawings illustrate only exemplary embodiments of this disclosure and are therefore not to be considered limiting of its scope, for the disclosure may admit to other equally effective embodiments.

DETAILED DESCRIPTION

The present disclosure will now be described more fully hereinafter with reference to the accompanying drawings, in which exemplary embodiments of the disclosure are shown. This disclosure may, however, be embodied in many different forms and should not be construed as limited to the exemplary embodiments set forth herein. Rather, these exemplary embodiments are provided so that this disclosure will be thorough and complete, and will fully convey the scope of the disclosure to those skilled in the art. Like reference numerals refer to like elements throughout.

The terminology used herein is for the purpose of describing particular exemplary embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," or "includes" and/or "including" or "has" and/or "having" when used herein, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

The description will be made as to the exemplary embodiments in conjunction with the accompanying drawings in FIGS. 1 to 9. Reference will be made to the drawing figures to describe the present disclosure in detail, wherein depicted elements are not necessarily shown to scale and wherein like or similar elements are designated by same or similar reference numeral through the several views and same or similar terminology.

FIG. 1 shows a regional cross section view of a semiconductor device in accordance with some embodiments of the instant disclosure. The exemplary device includes a substrate 100 over which multiple layers of integrated circuit devices and features are formed. For illustrational simplicity and clarity, some detail/sub components of the exemplary device are not explicitly labeled in the instant figure.

The substrate 100 may comprise a crystalline silicon substrate. The substrate may comprise various doped regions depending on design requirements (e.g., p-type substrate or n-type substrate). The doped regions may be doped with p-type dopant, such as boron or BF2; n-type dopant, such as phosphorus or arsenic; and/or combinations thereof. In some alternative embodiments, the substrate 100 may be made of other suitable elemental semiconductor, such as diamond or germanium; a suitable compound semiconductor material, such as silicon carbide, gallium arsenide, gallium phosphide, indium phosphide, indium arsenide, and indium antimonide; an alloy semiconductor including SiGe, SiGeSn, GaAsP, AlInAs, AlGaAs, GaInAs, GaInP, and GaInAsP; other suitable materials; or combinations thereof. Furthermore, although a bulk substrate is utilized in the instant illustrative example, in some embodiments, the substrate may include an epitaxial layer (epi-layer) and/or may include a semiconductor-on-insulator (SOI) structure, such as a silicon-on-insulator (SOI) structure, SiGe-on insulator (SiGeOI), Ge on insulator (GeOI) and the like.

Several functional regions may be arranged laterally (e.g., horizontally across the page as shown in FIG. 1) over the substrate. By way of example, FIG. 1 shows a substrate of an exemplary device that includes two co-planar arranged functional regions defined thereon, e.g., a cell region 110 and a periphery region 120. In the illustrated example, the cell region 110 provides space to accommodate active circuit components (e.g., selection transistor 112) and passive circuit components (e.g., storage element, such as capacitor 116) of a dynamic random access memory (DRAM) device. Meanwhile, the periphery region 120 houses circuit components for supporting various functions of the DRAM operation, such as read out circuits, decoder circuits, and amplifier circuits. Different functional regions may include circuit components of different critical dimensions based on different design rules. The devices in different functional regions may be designed to function under different operational requirements (e.g., different voltage rage). Devices of different feature dimensions may be arranged on the same plane of a substrate (e.g., circuit chip) to achieve higher degree of integration, hence reduce signal path and enhance device performance.

The cell region may comprise array of memory unit cells. Each of the memory cell units typically includes a bit storage component (e.g., storage capacitor 116) and a selection component (e.g., transistor 112). The unit cells may employ suitable cell architecture, e.g., a 1-T cell format (as shown in the instant example) or other types of cell arrangement (such as a 3T cell layout, not shown). The cell region 110 of the illustrated device are shown to have two gate structures 112 embedded (buried) under a top surface of the substrate 100 in an active area that rests between isolation features 111 (e.g., shallow trench isolation (STI) structure). In some embodiments, the active area may be a raised island structure (with respect to a lower surface of the substrate) comprising an elongated strip overhead profile and surrounded by isolation structure (e.g., STI 111). In some embodiments, the active area may be obliquely arranged with respect to the traversing direction of a word line (e.g., the extending direction of the gate structure 112, which is in/out of the page in the illustrated example) at a slanting angle. The oblique arrangement of the active areas in folded/offset layout may allow more units cells to be packed in a same area while maintaining sufficient distance therebetween, thus achieving higher device density while reducing inter-cell interference (e.g., cross talk).

The gate structure 112 may be part of a memory cell selection device, such as a buried channel array transistor (BCAT). In the illustrated example, the active area (defined between a pair of isolation features 111) comprises a pair of gate structures 112 (corresponding to a pair of BCATs whose respective source/drain (S/D) regions connected to a contact plug, e.g., contact plug/via 114). The contact plug 114 enables electrical connection between the selection transistor (e.g., BCAT) to a lower electrode (e.g., 116L) of a storage capacitor 116 (e.g., through a pad not specifically labeled). The gate structure 112 of an exemplary buried type device may comprise a recess-filling structure (in a cross sectional profile) buried in a gate trench in the active area of the substrate. In DRAM applications, the gate structure 112 may be a laterally traversing linear structure (e.g., extending in/out of the page of, e.g., FIG. 1) that intercepts multiple adjacent active areas (and serves as a word line (WL) for a memory device).

The gate structure 112 comprises a gate electrode (not labeled) embedded at a lower portion of the gate trench (e.g., partially filling) in the active area. The gate electrode may include one or more conductive material such as doped polysilicon, or metal material such as tungsten, ruthenium, and cobalt. The gate structure 112 also comprises a gate insulation liner that lines the bottom portion of the trench, and is arranged between the gate electrode and the semiconductor material of the active area. The gate insulation liner may be a conformally formed insulating layer covering an inner side wall of the gate trench. The gate insulating liner may be made of an insulating material such as silicon oxide, silicon nitride, silicon oxynitride, or a metal oxide. The metal oxide may include, for example, hafnium oxide, aluminum oxide, or titanium oxide. High-K dielectric materials may be utilized to complement metal based gate electrodes for enhancing the performance of a field effect transistor. In some embodiments, the gate structure 112 may further comprise a barrier liner conformally disposed between the gate insulating liner and the gate electrode. The gate barrier liner may comprise a barrier metal compound, such as, titanium nitride (TiN) or tantalum nitride (TaN).

In the quest to pursuit the ever-shrinking device form factor, the utilization of buried type transistor as selection device may ensure extended channel length (e.g., from a S/D region under a contact plug 114 vertically down to the bottom tip of the gate structure 112, then laterally across the tip of to the buried gate electrode and back up to the opposite S/D region under a neighboring contact plug), thereby achieving higher device density while alleviating the accompanied short channel effect. Nevertheless, selection device of other structural architecture may be utilized. For instance, in some embodiments, planar channel device or raised channel multi-gate devices (e.g., fin-type field effect transistor, FINFET) may also be used as selection device for a memory cell.

In the illustrated embodiment, a shared S/D region is defined between the pair of neighboring gate structures 112 in the active area (between STI structures 111). In some embodiments, bit line 113 is arranged over the shared S/D region formed between the gate structures 112 at a central region of the active area (between STI structures 111). The bit line 113 may be a linear conductive structure that extends in/out of the page as shown in the instant illustration, and electrically connects a plurality of S/D regions (at the respective central regions) of multiple active areas (e.g., the respective S/D region of a plurality of active areas that are arranged in a roll; not shown in the instant regional cross section view).

The contact plug 114 may be formed in and through a dielectric layer (e.g., interlayer dielectric, ILD) above the active area, thereby establishing a vertical conductive path from the surface of the substrate 100 to upper layers of the device stack over the active area. In some embodiments, the contact plug 114 may serve as a storage node via/plug that enables vertical electrical connection with a lower electrode of a storage element (e.g., electrode 116L of the capacitor element 116). The dielectric layer may be made of materials such as oxide or nitride of silicon. In some embodiments, the dielectric layer may include low-K material having dielectric constant lower than, e.g., 3.9. The contact plug 114 may be made of one or more metal or non-metal conductive material, such as poly-silicon, tungsten, aluminum, etc.

Storage element (such as storage capacitor 116) may be formed over the contact plug 114 (e.g., above the corresponding contact pad over the plug) in a dielectric layer 117. The storage capacitor 116 comprises lower electrode 116L, upper electrode 116U, and capacitor dielectric 116D arranged between the upper and the lower electrodes.

A separation layer (e.g., layer 115) may be provided over the contact plug 114, through which the lower electrode of the storage capacitor 116 (e.g., bottom electrode 116L) is formed to establish electrical connection with the contact plug 114. The separation layer may comprise nitride material, e.g., silicon nitride, and serve as etch stop during the fabrication process of the capacitor structure. It is noted that the term "lower" electrode is made with respect to the surface of the substrate for the ease of referral, and shall not be construed as an undue limitation as to device orientation. The contact plug 114 provides a vertical conduction path between the source/drain region of the selection device (e.g., transistor 112) and the lower electrode of the storage element (e.g., electrode 116L).

In some embodiments, the lower electrode 116L may be a cylindrical conductive structure having high aspect ratio (i.e., high depth to width ratio), which corresponds to a tall upward opening U-shaped cross sectional profile (as shown the instant example). In some embodiments, a lateral width of the conductive structure may be few tens of nanometer in scale, e.g., having critical dimension of about 40 nm. In some embodiments, the aspect ratio of the lower electrode 116L may range from about 10 to 40. The lower electrode 116L may be formed from a conformal conductive film made of one or more conductive material(s) such as BSRO ((Ba,Sr)RuO$_3$), CRO (CaRuO$_3$), LSCo ((La,Sr)CoO$_3$), TiN, TiAlN, TaN, TaAlN, W, WN, Ru, RuO$_2$, SrRuO$_3$, Ir, IrO$_2$, Pt, PtO, SRO (SrRuO$_3$).

The capacitor dielectric 116D may be a conformally formed layer that comprises a nitride, an oxide, a metal oxide, or a combination thereof. For example, the capacitor dielectric 116D may include a single or a multilayered film formed from silicon nitride, silicon oxide, a metal oxide (e.g., HfO$_2$, ZrO$_2$, Al$_2$O$_3$, La$_2$O$_3$, Ta$_2$O$_3$, and TiO$_2$), a perovskite dielectric material (e.g., STO (SrTiO$_3$), BST ((Ba,Sr)TiO$_3$), BaTiO$_3$, PZT, and PLZT, or a combination thereof. In some embodiments, high-K dielectric material may be applied to boost capacitor performance, e.g., enhance capacitance for a given electrode surface area.

The upper electrode 116U may be formed of one or more conductive material such as doped semiconductor, conductive metal nitride, metal, metal silicide, conductive oxide, or a combination thereof. For instance, the upper electrode 116U may be formed of conducive material(s) including BSRO ((Ba,Sr)RuO$_3$), CRO (CaRuO$_3$), LSCo ((La,Sr)CoO$_3$), TiN, TiAlN, TaN, TaAlN, W, WN, Ru, RuO$_2$, SrRuO$_3$, Ir, IrO$_2$, Pt, PtO, SRO (SrRuO$_3$), though the list of suitable material is merely exemplary and not exhaustive.

Additional conductive features, such as interconnect features 118 and 119 may be formed in additional inter metal dielectric layers over the upper electrode 116U to enable interconnection between circuit elements.

As the level of device integration increases, feature density also increases. By way of example, the feature density among the interconnect features (e.g., lateral interconnect components such as features 118/119/129, or vertical interconnect components such as features 114/124/126/128) is increased considerably in modern semiconductor devices compared to their preceding counterparts. As such, not only the feature dimension thereof shrinks, the inter-feature distance/separation is also reduced. Densely aggregated interconnect patterns in an inter metal dielectric layer may lead to adverse cross talk or parasitic effects. In some embodiments, voids (e.g., air gaps) may be incorporated between interconnect features to alleviate the above-mentioned undesirable effects.

The periphery region 120 may comprise various active device regions laterally separated by isolation features, such as STI 121. The active area may comprise active circuit components (such as transistors) that make up the periphery support circuits, e.g., read-out, decoder, or amplifier circuits. Over the active area there may be upper inter device layers, such as dielectric layer 127, through which contact via/plug 124 may be provided to enable vertical signal conduction from the surface of the substrate 100 to a higher device layer. The contact plug 124 may be connected to a corresponding contact pad (not specifically labeled) there-above in a fashion similar to that in the cell region 110.

Over the contact plug 124 of the presently illustrated embodiment is a dielectric layer 127, through which one or more high aspect ratio interconnect features (e.g., contact via 126) are formed. In some embodiments, the aspect ratio of the contact via 126 may have a range from about 10 to about 40. In some embodiments, the dielectric layer 127 may be (at least partially) a lateral extension of the dielectric layer 117 from the cell region 110. In some embodiments, the design rules for the devices in periphery region 120 may assume a greater feature sizes than that in the cell region 110. In some embodiments, the active circuit components in the periphery region 120 are designed to operate at a higher voltage level than those in the cell region 110.

As feature size decreases, metal materials are employed in the interconnect structure (e.g., lateral components 118/119/129 or vertical interconnect components 114/124/126/128) to ensure electrical performance. Moreover, in order to reduce electrical resistance and obtain interconnecting metal line of higher conductive quality, a higher deposition (or a subsequent reflow) temperature is applied (e.g., 350° C. to 550° C. range) when depositing the conductive material (e.g., Al) over the liner material (e.g., Ti). Reduced electrical resistance in the interconnect may enable faster device switching speed.

However, the incorporation of metal material in the interconnect structure leads to another sets of challenge. By way of example, diffusion or electromigration of metal materials in the interlayer dielectrics may generate contamination and shorting issues. Moreover, high temperature process condition facilitates reactions between the conductive material and the liner material in an unpredictable manner, which leads to the random generation of IMC of different phase compositions. In some applications, different conductive materials are employed in different interconnect components. The interface between different interconnect components where different metal materials meet, for example, may encounter intermetallic composites (IMCs) non-uniformity issues that leads to reduced electrical performance. For example, the thermal energy may cause reactions between aluminum (Al) interconnect metal and titanium (Ti) liner material, which results in the random generation among three possible major IMCs of titanium aluminide, namely, gamma TiAl, alpha 2-Ti$_3$Al and TiAl$_3$. As the atomic constitution of these IMCs are non-identical, the thickness variation in the resultant liner layer increases. In some applications, non-uniformity in the liner/interconnect metal layer affects the electrical property of the interconnect structure adversely.

Figure 2:
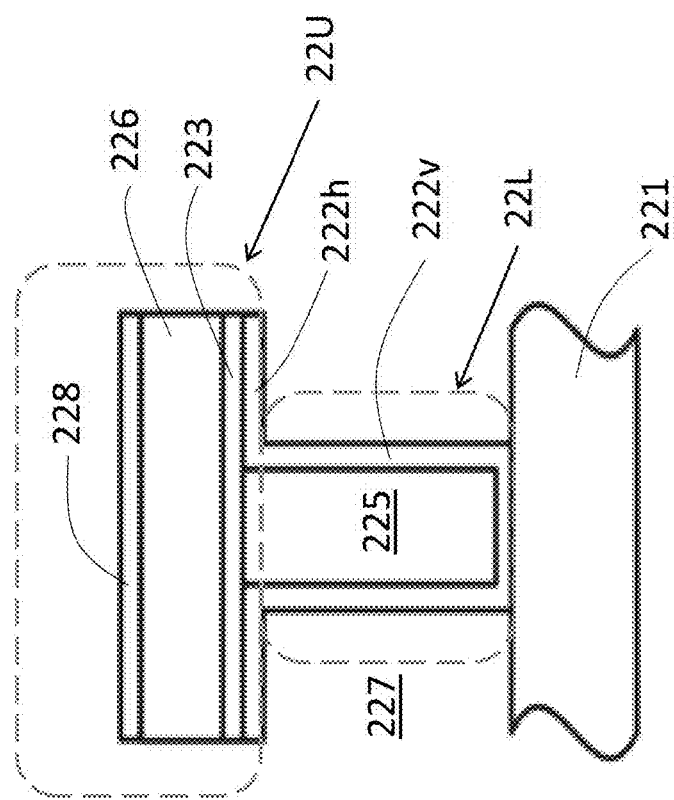
FIG. 2 illustrates a schematic regional cross-sectional view of an exemplary interconnect structure.

FIG. 2 illustrates a schematic regional cross-sectional view of an exemplary interconnect structure. The lower most portion of the illustrated interconnect structure includes a lower conductive feature 221 formed in a lower device layer (e.g., lower inter-metal dielectric layer, IMD). In some embodiments, the lower conductive feature 221 may be a landing pad above the landing plug 124 as shown in FIG. 1. In some embodiments, the lower conductive feature 221 may be a portion of a laterally traversing lower metal line that enables horizontal signal conduction. An inter-metal dielectric layer 227 is disposed over the lower conductive feature 221, and is patterned to form a vertical recess feature (to accommodate the vertical interconnect component 22L). In some embodiments, a lateral recess feature is further formed over the vertical recess feature (to accommodate the lateral interconnect component 22U).

In order to prevent diffusion and increase adhesion at the hetero-material interface (e.g., between the dielectric material 227 and the metal material 225/226) of the interconnect structure, a liner 222 of a barrier material is first disposed on the exposed recess surfaces of the vertical and lateral recess features before conductive material is filled into the recesses to form the vertical component 22U and the lateral component 22U, respectively. In some embodiments, the liner formation process comprises disposing a liner material that includes one or more of Titanium (Ti), Tantalum (Ta), or Chromium (Cr). Subsequently, conductive material that includes aluminum (Al) or copper (Cu) may be disposed on the liner material to concurrently fill the remaining vertical and lateral portions of the recesses, thereby forming the interconnect structure.

In some embodiments, a horizontal liner portion 222h is formed over the IMD layer 227. In some embodiments, the horizontal liner portion 222h shares a substantially coplanar top boundary with the vertical conductive filling (e.g., plug conductor) 225 in which it laterally surrounds. Meanwhile, a vertical liner portion 222v arranged between the vertical conductive filling 225 and the IMD layer 227 extends downwardly from the horizontal liner portion 222h. In some embodiments, the horizontal liner portion 222h is substantially removed during a planarization process. The conductive filling 225 and the barrier liner (e.g., 222v) cooperatively form a cross-layer via plug that penetrates across the IMD layer 227.

An interposing layer 223 having substantially uniform thickness is disposed over the plug conductor 225 and the liner 222. The interposing layer 223 extends laterally over a planar projection of the vertical interconnect component (e.g., plug conductor 225) and establishes electrical connection there-with. In the illustrated embodiment, the interposing layer 223 comprises a metal material such as titanium (Ti). In some embodiments, the interposing layer 223 is formed by PVD process to a thickness of less than about 100 nm.

An interconnect metal layer 226 is disposed over the interposing layer 223. The interconnect metal 226 may include one or more conductive materials such as W, Al, or Cu. In some embodiments, aluminum (Al) film is disposed by PVD process at a relatively high temperature range of about 350 to 450° C. to a thickness of over 100 nm. In some embodiments, metal layer deposition may be followed by a reflow process at a temperature range of about 500 to 550° C. to improve grain quality. In some embodiments, the thickness variation in the IMC layer 523' may be maintained sufficiently small (e.g., less than about 5%) to ensure predictable electrical characteristics through layer uniformity.

An overlay (e.g., etch-resisting/anti-reflective layer (ARL)) 228 is disposed over the lateral component (e.g., the conductive line 226) of the interconnect structure. In some embodiments, the overlayer 228 may comprise titanium (Ti). In some embodiments, the overlayer 228 is made of titanium nitride material with varying gradient content composition. For instance, a lower portion of the overlayer 228 (e.g., near the metal line 226) may comprise higher titanium content with respect to nitride. On the other hand, an upper portion (e.g., further away from the metal layer 226) of the overlayer 228 may be provided with higher nitride content. The overlayer 228 is provided in preparation for subsequent interconnect patterning process that forms the lateral conductive feature s (e.g., horizontal metal routings) of the interconnect structure, where the reduction of surface reflection over the metal layer 226 helps to maintain photolithography resolution/accuracy.

Upon completion of photolithography process, the interposing layer 223 and the metal layer 226 (as well as the remnant ARL 228) cooperatively form an intra-layer component (e.g., upper portion 22U) that that traverses laterally in a dielectric layer over the IMD layer (e.g., layer 227).

Figure 3C:
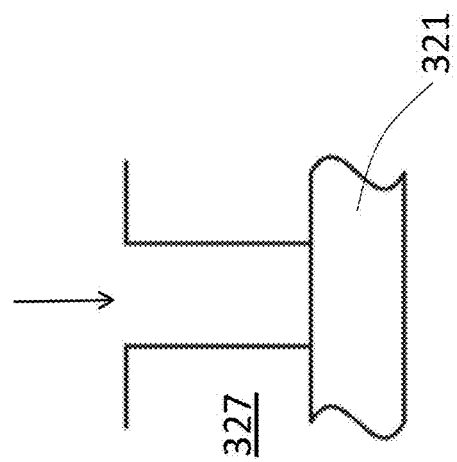
FIGS. 3A-3C are schematic illustrations that show intermediate structures during 10 various stages of fabrication processes in accordance with some embodiments of the instant disclosure.
Figure 3B:
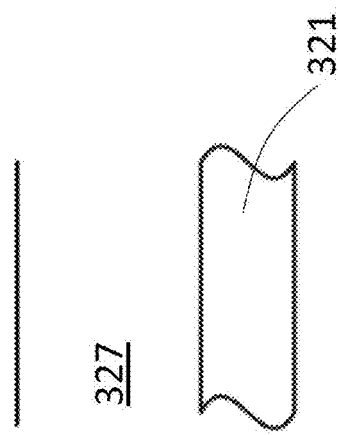
Figure 3A:
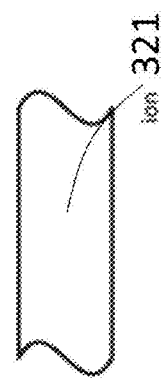

FIGS. 3A-3C are schematic illustrations that show intermediate structures during various stages of fabrication processes in accordance with some embodiments of the instant disclosure. For instance, FIG. 3A schematically illustrates a conductive feature 321 in a lower device layer over a substrate (e.g., the landing pad under the vertical interconnect component 126 as shown in FIG. 1). In some embodiments, the conductive feature 321 may be a portion of a lateral interconnect component in a lower device layer.

Referring to FIG. 3B, a dielectric layer 327 is disposed over and covers the conductive feature 321 in a lower device layer. In some embodiments, the dielectric layer 327 may include oxide materials such as silicon oxide, which forms part of an IMD layer. In some embodiments, low-K materials may be used in the inter-metal dielectric layer to reduce parasitic coupling between interconnect features, thereby reducing signal delay and enhance device performance. In some embodiments, voids (e.g. air gaps) may be provided in the IMD to further decrease overall dielectric constant of the IMD layer.

Referring to FIG. 3C, the dielectric layer 327 is patterned and etched to form a recess feature that enables access to a designated portion of the conductive feature 321. In some embodiments, a recess feature with high aspect ratio (i.e., depth/width>1) is formed through suitable etching technique(s). In some embodiments, the aspect ratio of the recess feature may be in a range of about 10 to about 40.

Figure 4C:
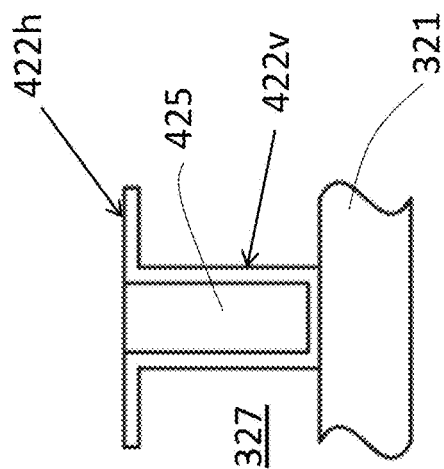
FIGS. 4A-4C are schematic illustrations that show intermediate structures during various stages of fabrication processes in accordance with some embodiments of the instant disclosure.
Figure 4B:
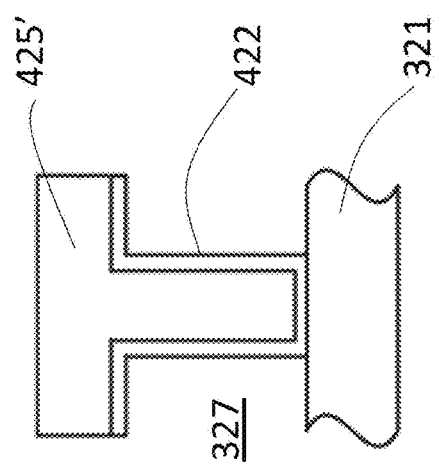
Figure 4A:
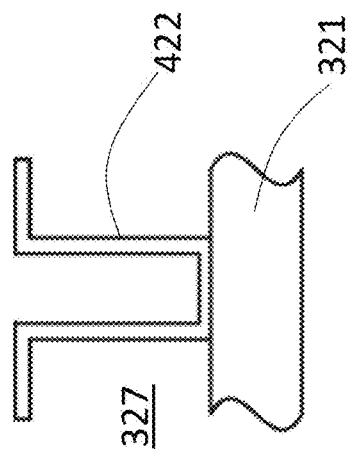

FIGS. 4A-4C are schematic illustrations that show intermediate structures during various stages of fabrication processes in accordance with some embodiments of the instant disclosure. Particularly, the instant figures illustrate a formation process for a vertical component of an interconnect structure capable of mitigating metal filling challenges in small form-factor, high aspect ratio recesses in interconnect structures.

Referring to FIG. 4A, a liner 422 is disposed over exposed surfaces of the vertically extending recess feature (e.g., the recess feature shown in FIG. 3C) that provides selective access to an interconnect feature 321 in a lower device layer.

The material for the liner 422 may be selected to improve adhesion between the underlying dielectric material (e.g., of the IMD 327) and the subsequently disposed conductive material (e.g., vertical component 425 as shown in FIG. 4C The material for the liner 422 may also be selected to prevent diffusion of the subsequently disposed conductive material in the vertical component of the interconnect structure as set forth in previous embodiments. In some embodiments, the liner 422 may include a titanium containing material. In some embodiments, liner material such as Ti, TiN, W, WN, Ta, TaN may be formed by thin film deposition techniques such as physical vapor deposition (PVD), chemical vapor deposition (CVD), or atomic layer deposition (ALD). As illustrated in FIG. 4A, the liner 422 is formed with a substantially uniform thickness over exposes surfaces (e.g., top horizontal portion, vertical portion, and the bottom horizontal portion) of the recess feature without filling the via hole.

Referring to FIG. 4B, conductive material 425' is disposed over the liner 422 to fill the remaining portion of the via hole. Suitable deposition processes such as PVD, CVD, ALD, or plating may be employed. In some embodiments, the conducive material 425' for forming the vertical interconnect component may include W, Al, or Cu. As shown in the instant figure, excessive conductive material 425' is also formed over the horizontal portions of the liner 422. The deposition process substantially fills the via hole (between the vertical/bottom portion of the liner 422) with conductive material.

Referring to FIG. 4C, a planarization process (e.g., chemical mechanical polishing, CMP) is performed to remove the excessive lateral coverage of the conductive material, thereby forming a vertical conductive feature (which includes the vertical conductive filling 425) in the IMD 327. In some embodiment (such as that shown in the instant illustration), the CMP process leaves a horizontal liner portion 422h over the IMD layer 327. Meanwhile, a vertical liner portion 422v extends downwardly from the horizontal liner portion 422h and situates between the vertical conductive filling 425 and the IMD layer 327. In some embodiments, the horizontal liner portion 422h is substantially removed during the planarization process. The conductive filling 425 and the barrier liner 422 cooperatively form a cross-layer via plug that penetrates across the IMD layer 327 (e.g., electrically connecting intra-layer/lateral conductive feature s of different levels).

Figure 5C:
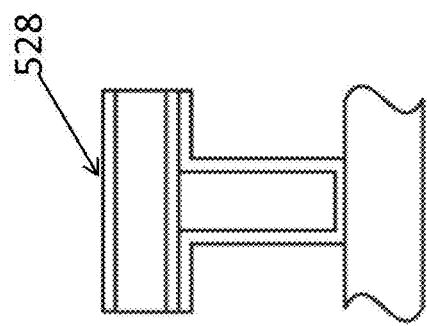
FIGS. 5A-5C are schematic illustrations that show intermediate structures during various stages of fabrication processes in accordance with some embodiments of the instant disclosure.
Figure 5B:
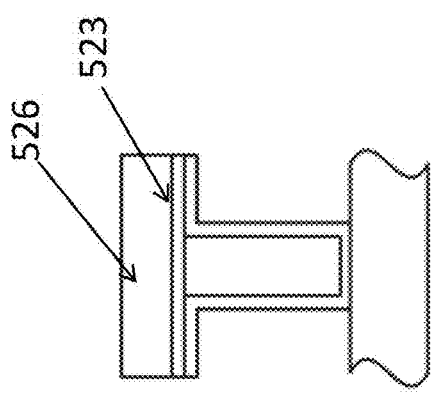
Figure 5A:
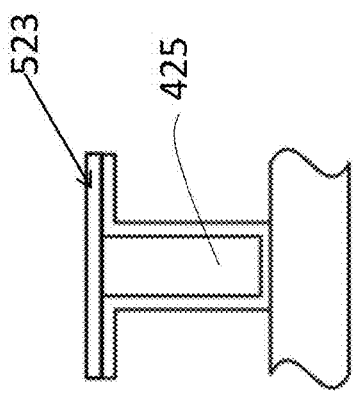

FIGS. 5A-5C are schematic illustrations that show intermediate structures during various stages of fabrication processes in accordance with some embodiments of the instant disclosure. Particularly, the instant figures illustrate a fabrication process for forming a lateral conductive interconnect structure capable of further mitigating the IMC uniformity issue.

Referring to FIG. 5A, an interposing layer 523 having substantially uniform thickness is disposed over the planar surface resulted from a planarization process (e.g., as illustrated by FIG. 4C). The interposing layer 523 extends laterally over a planar projection of the vertical interconnect component (e.g., via plug metal 425) and establishes electrical connection there-with. The forming of the interposing layer 523 includes disposing an intermetallic material of substantially unitary composition, where the intermetallic material includes a metal component identical to that in a subsequently disposed horizontal interconnect conductor (e.g., metal layer 526 as shown in FIG. 5B). In some embodiments, the interposing layer 523 comprises a metal material such as titanium (Ti). In the instant embodiment, intermetallic material of substantially unitary composition of the interposing layer 523 consists essentially of TiAl. In some embodiments, the interposing layer 523 is formed by PVD process with a thickness of less than 100 nm. In some embodiments, the deposition process for the interposing layer 523 is performed under a relatively low temperature condition (e.g., lower than about 350° C.). In some embodiments (e.g., memory applications such as dynamic random access memory (DRAM)), the interposing layer 523 may be provided with a thickness in a range of about 50-500 Å. In some embodiments, an overall thickness variation in the interposing layer 523 is no more than about 5%.

Referring to FIG. 5B, an interconnect metal layer 526 is disposed over the interposing layer 523 at a relatively high temperature condition. The interconnect metal 526 may include one or more materials such as W, Al, or Cu. In the illustrated embodiment, aluminum (Al) film is disposed by PVD process at a temperature range of about 350 to 450° C. to a thickness of over 100 nm. In some applications (e.g., DRAM), the interconnect metal layer 526 may be provided with a thickness in a range of about 1000 Å-1 um. In some embodiments, metal layer deposition may be followed by a reflow process at a temperature range of about 500 to 550° C. In some embodiments, the thickness variation in the interposing layer 523 is no more than about 5% with respect to a regional thickness of the interposing layer 523 in the planar projection region over the vertical interconnect component (e.g., the via plug 425/422 as shown in FIG. 4(c)). In some embodiments, a thickness ratio between the interposing layer 523 and the lateral conductive feature (e.g., metal layer 526) has a value in a range from about 0.005 to 0.5. In some embodiments, the thickness ratio of interposing layer to the metal layer ranges from about 0.01 to about 0.1. In some embodiments, the thickness ratio between interposing layer to metal layer ranges from about 0.1 to about 0.4.

The presence of the IMC interposing layer 523 of unitary composition under the conductive line (e.g., interconnect metal layer) 526 prohibits the spontaneous reaction as mentioned previously, even under higher deposition temperature conditions. Meanwhile, because of the substantially unitary molecular constitution in the interposing layer 523 (e.g. gamma TiAl), the thickness uniformity of the interposing layer 523 may be maintained. Accordingly, relatively higher deposition temperature may be applied without undue worries during the metal layer formation process to improve grain quality of the interconnect metal layer 526.

Referring to FIG. 5C, an anti-reflective layer (ARL) 528 is disposed over the lateral component (e.g., the conductive line 526) of the interconnect structure. In some embodiments, the ARL may comprise titanium (Ti). In some embodiments, the ARL 528 is made of titanium nitride material with varying gradient content composition. For instance, a lower portion of the ARL 528 (e.g., near the metal layer 526) may comprise higher titanium content with respect to nitride. On the other hand, an upper portion (e.g., further away from the metal layer 526) of the ARL 528 may be provided with higher nitride content. The ARL 528 is provided in preparation for subsequent interconnect patterning process that forms the lateral conductive feature s (e.g., horizontal metal routings) of the interconnect structure, where the reduction of surface reflection over the metal layer 526 helps to maintain photolithography resolution/accuracy. In addition, the ARL 528 over the metal layer 526 may increase adhesion between the lateral interconnect component with subsequently formed dielectric layer, thereby improving structural integrity and thus reliability of the electrical device.

Figure 6:
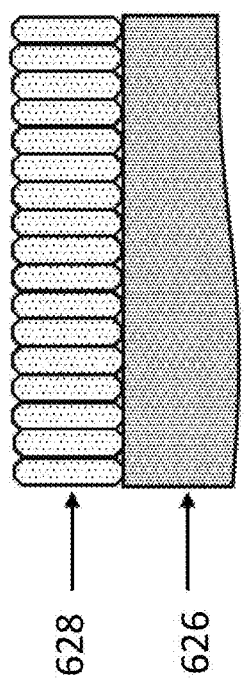
FIG. 6 shows a schematic illustration of an upper portion of an interconnect structure in accordance with some exemplary embodiments.

FIG. 6 shows a schematic illustration of an upper portion of an interconnect structure in accordance with some exemplary embodiments. The exemplary interconnect structure comprises an anti-reflection layer 628 formed over a top surface of the lateral interconnect component (e.g., metal line 626). In some embodiments, the interconnect metal patterning process involves photo-resist (PR) coating, pattern developing, and etching of the metal thin film (e.g., Al layer) on silicon wafer (which has about 200% reflectivity with respect to the wavelength for the photolithography process). High reflectivity generally affects the efficiency of exposure.

In some embodiments, the anti-reflection layer 628 consists essentially of titanium-nitride composition. The employment of anti-reflection layer (e.g., layer 628) helps to reduce reflectivity over the surface to be patterned. For instance, a titanium-rich TiN layer may reduce reflectivity to about 100% or less, while a nitrogen-rich TiN may further reduce reflectivity to 70% or less. As shown in the instant example, a nitrogen-rich TiN anti-reflection layer 628 (which is characterized by a columnar grain pattern due to its crystal orientation) is applied over the metal line 626. The columnar grain structure of the nitrogen-rich anti-reflection layer 628 forms a coarse top surface that provides enhanced reflectivity reduction properties. However, the relatively loose columnar structure is more pervious to etching chemical during metal line patterning, thus provides less protection to the underlying metal structures. The chemical corrosion issue manifests itself particularly during photo rework process, where out-of-spec PR patterns are to be removed (e.g., by ashing, stripping) for PR re-deployment. In some cases, ring type defects or corrosion issues may occur as a result.

Figure 7:
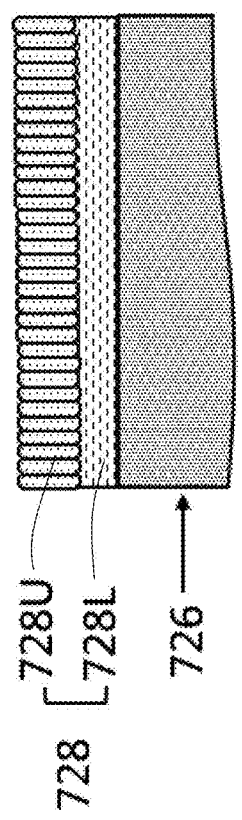
FIG. 7 shows a schematic illustration of an upper portion of an interconnect structure in accordance with some embodiments of the instant disclosure.

FIG. 7 shows a schematic illustration of an upper portion of an interconnect structure in accordance with some embodiments of the instant disclosure. In some embodiments, the exemplary interconnect structure comprises an overlayer 728 formed over a top surface of the lateral interconnect component (e.g., metal line 726). The overlayer 728 comprises a fine grain lower sub-layer 728L and a coarse grain upper sub-layer 728U.

In some embodiments, the overlayer 728 is formed by physical vapor deposition (PVD). The PVD process may employ various types of power source, such as direct current (DC), alternating current radiofrequency (AC RF), and pulsed power. In some embodiments, the overlayer 728 consists essentially of TiN compound. In some embodiments, the overlayer 728 may be formed by reactive sputtering (i.e., one type of PVD) using titanium (Ti) target in a chamber ambient having argon (Ar) and nitrogen (N2) gases.

During reactive sputtering, N2 gas may be pumped incrementally into the sputtering chamber to increase nitridation concentration. Within a specific range of N2 gas concentration, titanium nitride (TiN) may be deposited as anti-reflection overlayer on the surface of Al conductor. Moreover, by adjusting the ambient N2 concentration in the chamber, Ti-rich or N-rich TiN film may be formed. For example, when the N2 concentration in the chamber is higher than a particular threshold, a nitride-rich TiN film having characteristics such as dark brown color and columnar crystalline structure may be formed. On the other hand, when N2 ambient concentration in the chamber is lower than a particular threshold, a titanium-rich TiN film having characteristics such as gold color and fine grain crystalline structure may be generated.

In some embodiments, an atomic ratio of titanium to nitrogen in the lower sub-layer 728L is greater than about 1.1:1. In some embodiments, an atomic ratio of titanium to nitrogen in the upper sub-layer 728U is less than 1:1.2. The upper sub-layer 728U having columnar grain structure provides a coarse surface that enhances anti-reflection properties, while the lower sub-layer 728L having finer grain structure offers higher chemical resisting capabilities to ensure durability of the overlayer 728 through multiple re-work processes if necessary. In some embodiments, the overlayer 728 helps to extend photo rework counts to over 3 times.

Figure 8:
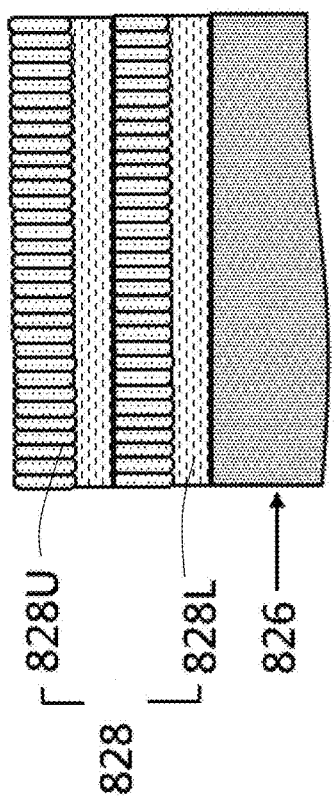
FIG. 8 shows a schematic illustration of an upper portion of an interconnect structure in accordance with some embodiments of the instant disclosure.

FIG. 8 shows a schematic illustration of an upper portion of an interconnect structure in accordance with some embodiments of the instant disclosure. In some embodiments, the exemplary interconnect structure comprises an overlayer 828 formed over a top surface of the lateral interconnect component (e.g., metal line 826). The overlayer 828 comprises additional fine grain sub-layer(s) and additional coarse grain sub-layer(s) interleavingly arranged between the fine-grain lower sub-layer 828L and the coarse-grain upper sub-layers 828U. In some embodiments, the ARL TiN overlayer may include multiple stacks of columnar-structured N-rich TiN sub-layer and fine-grained Ti-rich TiN sub-layer to provide higher anti-reflectivity and chemical resistance performance. A multiple stack may be, for example, composed of N-rich TiN sub-layer followed by Ti-rich TiN sub-layer repeatedly (e.g., N-rich TiN/Ti-rich TiN/N-rich TiN/Ti-rich TiN overlayer).

Figure 9:
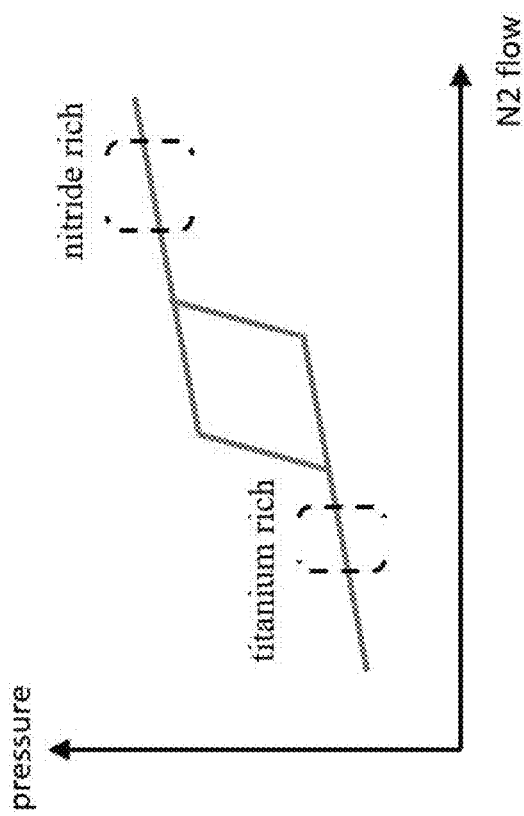
FIG. 9 shows an exemplary plot of a deposition conditions when forming an overlayer in accordance with some embodiments of the instant disclosure.

FIG. 9 shows an exemplary plot of a deposition condition when forming an overlayer in accordance with some embodiments of the instant disclosure. In some embodiments, the forming of an overlayer (e.g., layer 728) over a metal layer (e.g., layer 726) comprises performing physical vapor deposition with Ar gas flow in a range of about 10-40 sccm. In some embodiments, the forming of an overlayer over a metal layer comprises performing physical vapor deposition in a power range of about 5-20 kW. In some embodiments, the forming of fine grain lower sub-layer comprises performing physical vapor deposition with N2 gas flow in a range of about 30-60 sccm. In some embodiments, deposition of fine grain lower sub-layer is performed in a lower pressure condition. In some embodiments, the forming of coarse grain upper sub-layer comprises performing physical vapor deposition with N2 gas flow in a range of about 90-150 sccm. In some embodiments, deposition of coarse grain upper sub-layer is performed in a higher pressure condition.

In some embodiments, the overlayer may be provided with a thickness ranging from about 300 Å to 800 Å. In some embodiments, the fine-grained TiN sub-layer may be provided with have a thickness range of about 100-300 Å. In some embodiments, the columnar-structured TiN sub-layer may be provided with a thickness range of about 200-500 Å.

Accordingly, one aspect of the instant disclosure provides a conductive structure, which comprises: an upper conductive line arranged above and in electrical connection with a circuit component in a lower device layer through a via plug, wherein the upper conductive line extends laterally over the via plug; an interposing layer having a substantially uniform thickness arranged between the via plug and the upper conductive line, and extending laterally beyond a planar projection of the via plug, wherein the upper conductive line is in electrical connection with the via plug through the interposing layer; and an overlayer is disposed over the upper conductive line.

In some embodiments, a thickness variation in the interposing layer is no more than about 5% with respect to a regional thickness of the interposing layer in the planar projection region of the via plug.

In some embodiments, a thickness variation in the interposing layer is no more than about 5%.

In some embodiments, the interposing layer consists essentially of a substantially unitary intermetallic material that includes a metal species identical to that in the upper conductive line.

In some embodiments, the substantially unitary intermetallic material consists essentially of TiAl.

In some embodiments, the overlayer consists essentially of titanium-nitride composition.

In some embodiments, the overlayer comprises a fine grain lower sub-layer and a coarse grain upper sub-layer.

In some embodiments, wherein an atomic ratio of titanium to nitrogen in the lower sub-layer is greater than about 1.1:1.

In some embodiments, an atomic ratio of titanium to nitrogen in the upper sub-layer is less than 1:1.2.

In some embodiments, the conductive structure further comprises additional fine grain sub-layer and additional coarse grain sub-layer between the lower and the upper sub-layers.

Accordingly, another aspect of the instant disclosure provides a method of forming a conducting structure in a semiconductor device, which comprises the processes of: patterning a first recess feature through a dielectric layer to enable access to a conductive feature in a lower device layer; forming a vertical conductive feature in the first recess feature; forming, under a first process temperature, an interposing layer with substantially uniform thickness extending laterally over a planar projection of the vertical conductive feature and in contact with the vertical conductive feature; and forming, under a second process temperature, a metal layer over the interposing layer, wherein the second process temperature is higher than the first process temperature, forming an overlayer over the metal layer, wherein the overlayer contains titanium and comprise a fine grain lower sub-layer and a coarse grain upper sub-layer; and patterning the interposing layer and the metal layer through the overlayer to form a lateral conductive feature over and in contact with the vertical conductive feature.

In some embodiments, the forming of the interposing layer includes disposing an intermetallic material of substantially unitary composition, wherein the intermetallic material includes a metal component identical to that in the lateral conductive feature.

In some embodiments, the intermetallic material consists essentially of TiAl.

In some embodiments, a thickness ratio between the interposing layer and the lateral conductive feature ranges from about 0.01 to 0.1.

In some embodiments, the method further comprises disposing a liner layer around an outer periphery of the vertical conductive feature before the forming of an interposing layer.

In some embodiments, the forming of a metal layer over the interposing layer comprises performing a physical vapor deposition process at about 350 to 450° C. to a thickness of over 100 nm.

In some embodiments, the forming of a metal layer over the interposing layer 20 comprises performing a thermal treatment process at about 500 to 550° C.

In some embodiments, the forming of an overlayer over the metal layer comprises performing physical vapor deposition with Ar gas flow in a range of about 10-40 sccm.

In some embodiments, the forming of fine grain lower sub-layer comprises performing physical vapor deposition with N2 gas flow in a range of about 30-60 sccm.

In some embodiments, the forming of coarse grain upper sub-layer comprises performing physical vapor deposition with N2 gas flow in a range of about 90-150 sccm.

The embodiments shown and described above are only examples. Many details are often found in the art such as the other features of a logistics data management method. Therefore, many such details are neither shown nor described. Even though numerous characteristics and advantages of the present technology have been set forth in the foregoing description, together with details of the structure and function, the disclosure is illustrative only, and changes may be made in the detail, especially in matters of shape, size, and arrangement of the parts within the principles, up to and including the full extent established by the broad general meaning of the terms used in the claims. It will therefore be appreciated that the embodiments described above may be modified within the scope of the claims.

What is claimed is:

1. A method of forming a conducting structure in a semiconductor device, comprising:
    patterning a first recess feature through a dielectric layer wherein a conductive feature is accessible in a lower device layer via the first recess feature;
    forming a vertical conductive feature in the first recess feature;
    forming, under a first process temperature, an interposing layer of substantially an uniform thickness extending laterally over a planar projection of the vertical conductive feature, the interposing layer being in contact with the vertical conductive feature;
    forming, under a second process temperature, a metal layer over the interposing layer, wherein the second process temperature is higher than the first process temperature;
    forming an over layer over the metal layer, wherein the overlayer contains titanium and comprises a fine grain lower sub-layer and a coarse grain upper sub-layer; and
    patterning the interposing layer and the metal layer through the overlayer to form a lateral conductive feature, the lateral conductive feature being over and in contact with the vertical conductive feature.

2. The method of claim 1, wherein forming of the interposing layer comprises disposing an intermetallic material of a substantially unitary composition, wherein the intermetallic material includes a metal component same as a metal component in the lateral conductive feature.

3. The method of claim 2, wherein the intermetallic material comprises essentially TiAl.

4. The method of claim 1, wherein a thickness ratio between the interposing layer and the lateral conductive feature ranges from about 0.01 to 0.1.

5. The method of claim 1, further comprising disposing a liner layer around an outer periphery of the vertical conductive feature before forming of the interposing layer.

6. The method of claim 1, wherein the metal layer is formed by performing a physical vapor deposition process at about 350 to 450° C. to a thickness of over 100 nm.

7. The method of claim 1, wherein the metal layer is formed by performing a thermal treatment process at about 500 to 550° C.

8. The method of claim 1, wherein the over layer is formed by performing physical vapor deposition with Ar gas flow in a range of about 10-40 sccm.

9. The method of claim 1, wherein the fine grain lower sub-layer is formed by performing physical vapor deposition with $N_2$ gas flow in a range of about 30-60 sccm.

10. The method of claim 1, wherein the coarse grain upper sub-layer Is formed by performing physical vapor deposition with $N_2$ gas flow in a range of about 90-150 sccm.

* * * * *